United States Patent

Burrows et al.

[11] Patent Number: 6,058,229
[45] Date of Patent: May 2, 2000

[54] LONG WAVELENGTH INGAAS PHOTOGENERATOR

[75] Inventors: Ellsworth C. Burrows, Woodbridge; Joseph Carmine Centanni, Oceanport; Andrew Gompers Dentai, Atlantic Highlands; Clinton Randy Giles, Whippany; Lawrence Warren Stulz, Neptune, all of N.J.

[73] Assignee: Lucent Technologies Inc., Murray Hill, N.J.

[21] Appl. No.: 09/166,626

[22] Filed: Oct. 5, 1998

[51] Int. Cl.[7] .................................................. G02B 6/28
[52] U.S. Cl. ............................ 385/24; 257/82; 257/432; 257/458
[58] Field of Search ............................ 257/184, 458, 257/437, 201, 82, 432; 385/24

[56] References Cited

U.S. PATENT DOCUMENTS

5,568,576  10/1996  Takai et al. ............................ 385/24
5,714,773  2/1998  Burrows et al. ....................... 257/82

*Primary Examiner*—Hung N. Ngo

[57] ABSTRACT

The specification describes lightwave systems with remotely powered photoelectric generators. Optical power transmitted through the fiber is incident on a remotely located photodiode array. High power conversion efficiency coupled with a specially designed diode array generates sufficient power to operate electromechanical or electrooptic apparatus in the remote station. Long wavelength photodiodes in a circular or polygonal circularly symmetric array are serially connected to increase the voltage to practical operating levels. The photodiodes are fabricated to allow back lighting of the array. The bottom contact layer is made transparent to the wavelength of the power signal. This arrangement allows the contact area to extend over the entire front surface of the diode to reduce contact resistance. It also gives nearly optimum fill factor. The front surface may be metallized so the incident light undergoes a double pass through the absorbing layer.

25 Claims, 6 Drawing Sheets

LONG WAVELENGTH INGAAS PHOTOGENERATOR

FIELD OF THE INVENTION

This invention relates to micropower generators that are particularly adapted for powering remote devices in lightwave networks. The generators use light propagated through an optical fiber to power the generator. The photoelectric converters are diode arrays.

BACKGROUND OF THE INVENTION

In the early development of optical fiber communications systems, designers proposed to power subscriber equipment using light propagated through the fiber. This remote powering scheme was thought to be an added attraction to lightwave communications, and would open new communications service opportunities. As the system designers and device designers explored this new possibility it was discovered that devices necessary to implement the concept were not available. The optical power density in a typical optical fiber transmission system was too low for practical power levels to be realized at the remote end. The compromise was to transmit telemetry signals to activate power stations located at the subscriber location. Telemetry signals could be multiplexed with data and voice information, so intelligent systems with considerable versatility were designed and implemented. In some cases these systems are remotely powered electrically, and others are optically powered at the remote location using photoelectric generators. But the goal of optically controlling mechanical or electrooptic functions at a remote location using power from the optical fiber has received new impetus by recent developments using III–V photogenerators serially connected to achieve practical voltage levels. See, e.g., Dentai et al, "High-Voltage (2.1 V) integrated InGaAs photogenerator", Electronic Letters, Vol. 33, No. 8, pp. 718–719 (1997). With this realization of practical power levels in remotely powered photogenerators, continued improvements in these devices are sought.

SUMMARY OF THE INVENTION

We have developed new and improved photogenerator devices that further increase the levels of power that can be generated at remote lightwave stations. Voltage levels of 9 volts have been demonstrated. Moreover, the saturation current, and the photoresponse time of the device are improved. The improvements have been realized by constructing the device to allow back illumination. This allows greater contact area for the electrical interconnections, and improves photogenerator performance in at least four ways: contact resistance is reduced, the useful area of the device is increased, antireflection coatings can be used on the illuminated surface, and metallization on the front surface provides a mirror to reflect light that is not absorbed on the first pass back into the absorbing layer. The last result allows the thickness of the absorbing layer to be reduced.

DETAILED DESCRIPTION

Figure 1:
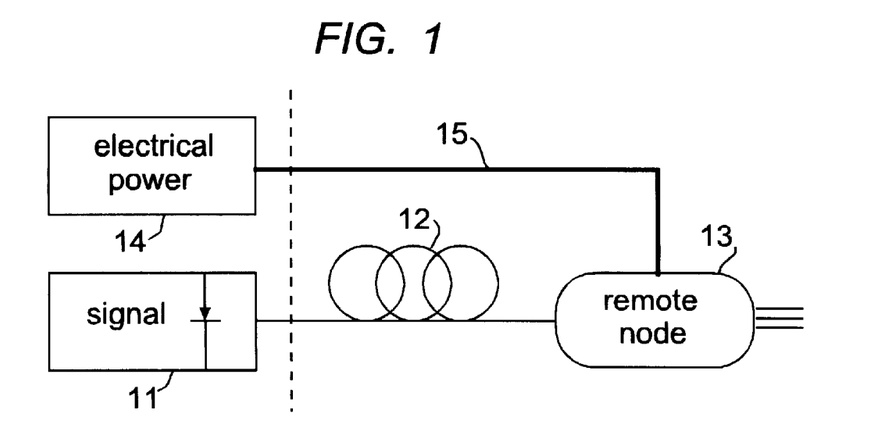
FIGS. 1–5 illustrate alternative arrangements for providing power to a remote station.

FIGS. 1–5 show various alternatives to remotely powering electromecanical or electrooptic devices. In FIG. 1, optical signal 11, typically from a modulated laser source, is transmitted over a length of optical fiber cable 12 to remote station 13. Electrical power is supplied to the remote station from power source 14 over a length of electrical power cable typically corresponding to fiber cable 12.

In the figures the convention followed for illustrating the electrical and optical paths is to show the electrical wire or cable as a thicker line to distinguish from the characteristically thinner optical fiber.

Figure 2:
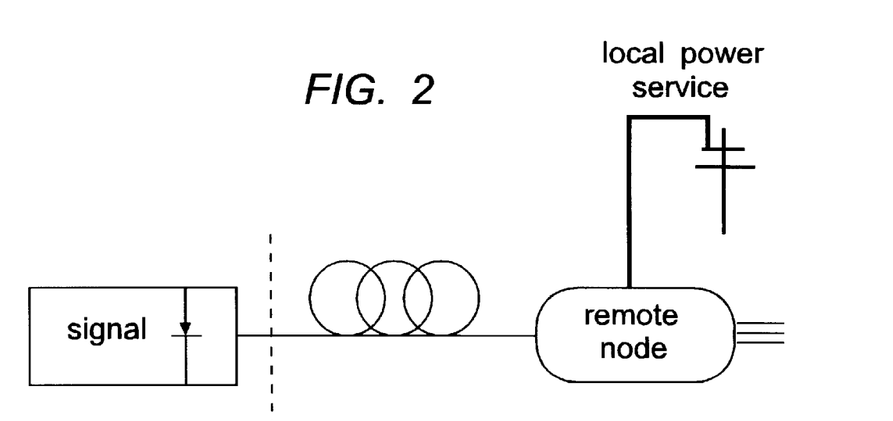

In FIG. 2 the remote electrical power is replaced by local power as shown. It will be recognized by those skilled in the art that many applications in which power at the remote station is desired either do not have local power available, or it is not cost effective, or will not be found cost effective in view of the invention described here.

Figure 3:
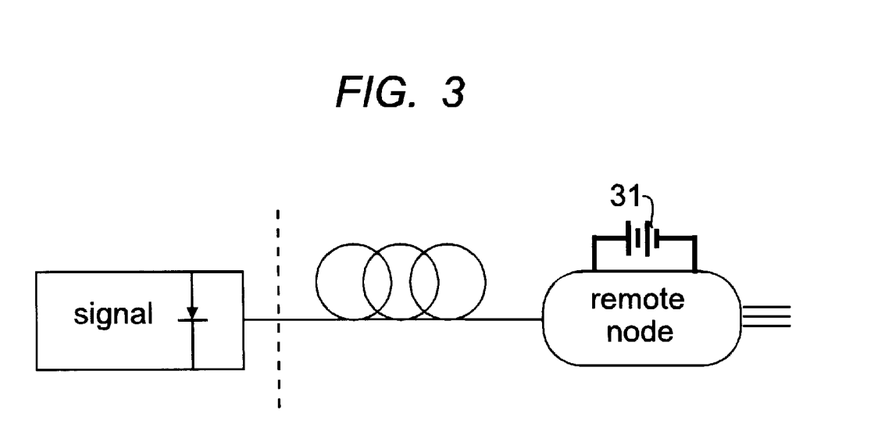

In FIG. 3 the remote power is provided by battery 31. Systems are in wide use that employ batteries at a remote station, and many also have means for charging the batteries from photodiode arrays (not shown in the figure) at the remote location.

Figure 4:
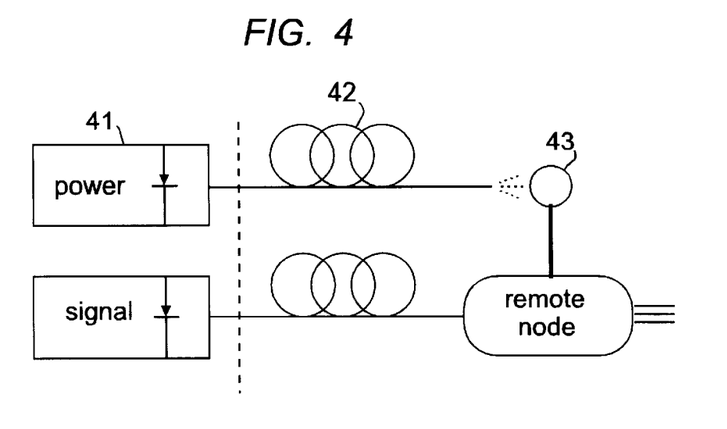
Figure 5:
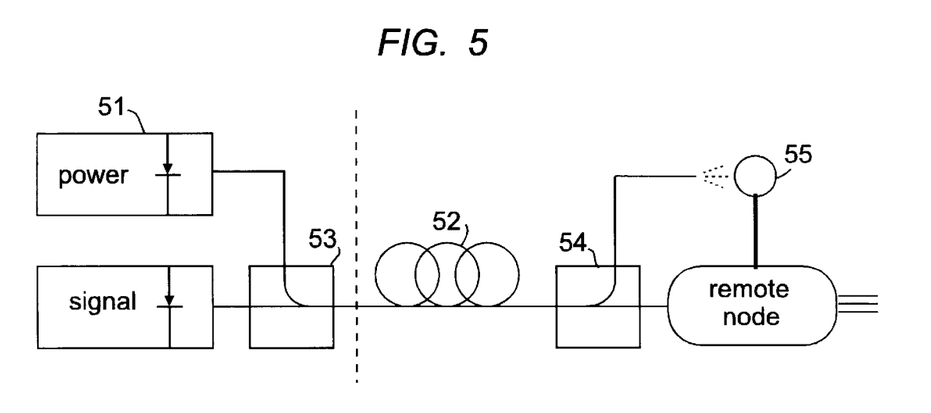

The options that are addressed with this invention are shown in FIGS. 4 and 5 wherein an optical power source, 41, 51, is located at the sending station with the optical signal. In FIG. 4 the optical power is transmitted over a separate optical fiber 42 with the output end of that fiber incident on the remote power generator 43. In FIG. 5 the optical power is transmitted over the same fiber 52 as the optical signal, using multiplexer 53 to combine the signals. Light for the power generator is separated from the signal at demultiplexer 54 and is focused on the detector array 55 to power equipment at the remote node. The generators 43 and 55 of FIGS. 4 and 5 are arrays of photodiodes according to the invention.

A fundamental limitation in remotely powered photodiodes is the beam size, corresponding to a typical fiber core diameter. This limits the amount of optical power that can be propagated through an optical fiber waveguide. The optical power is too small for practical implementation of remote power for many prior art systems. We have found that using relatively long wavelength laser diodes, the power conversion efficiency can be made very high. Use of long wavelength diodes for remotely powered systems has been discouraged by the fact that typically the light absorbing layer of these devices has a narrow bandgap, and thus the photodiodes yield power at a fraction of a volt. We have overcome this limitation by constructing a photodiode array, with the diodes interconnected in series. We have demonstrated the effectiveness of this technique with the thirty diode photodiode array shown in FIG. 6. This array is optimized for uniformity in the level of photogenerated current from individual elements of the array, as well as for fill factor, i.e. the match between the geometry of the array and the optical beam from the fiber. The device of FIG. 6 enables power generation at 10 volts, well within the range necessary to power electromechanical or electrooptic equipment.

Figure 6:
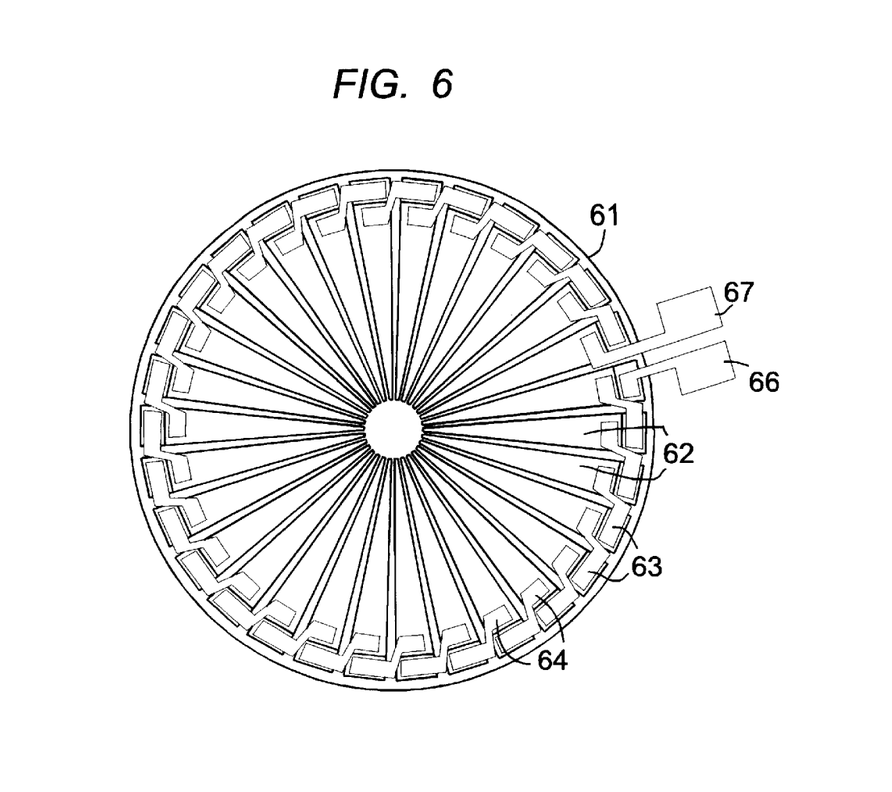
FIG. 6 is a diagram of a photodiode array according to one embodiment of the invention.

The array, shown generally at 61, has 30 segments 62, each one a photodiode, arranged in a pie shaped configuration as shown. The photodiodes 62 are interconnected with metal electrode straps as shown, with the electrode portion 63 contacting the bottom layer of each photodiode and the electrode portion 64 contacting the top layer of each photodiode. Pad 66 contacts the n-type side of the array, and pad 67 contacts the p-type side of the array.

Figure 7:
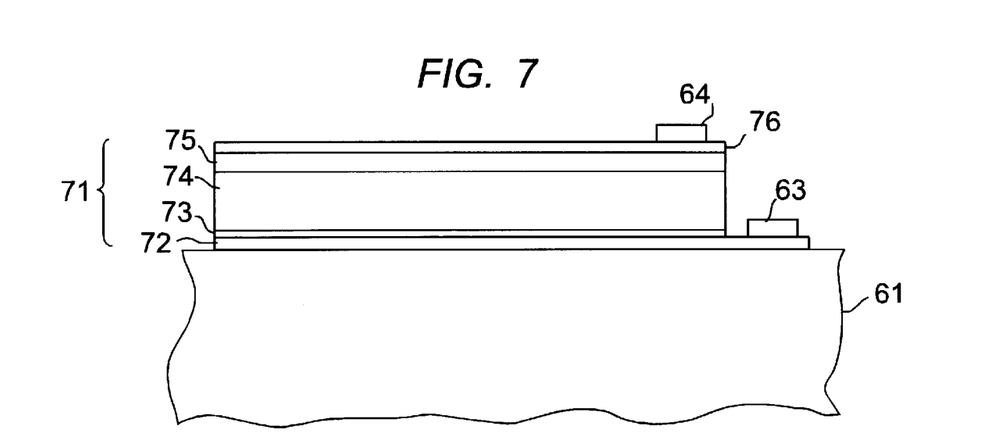
FIG. 7 is a section of one of the diode elements of FIG. 6.

This 30 segment array is representative of geometries that are shaped to the beam spot and have essentially circular symmetry. A circularly symmetric array is one in which the mirror images from two diagonals of the array at 90° essentially match the original image. The array of FIG. 6 is comprised of segments of a circle which comprises the substrate wafer 61. Each segment has a small region at the edge of the wafer where the photodiode stack is etched away to expose the lower contact layer. This is shown in more detail in the section view of FIG. 7. The section of FIG. 7 is taken through a radius of the substrate 61. In the preferred embodiment, the p-i-n photodiodes are InP based. The substrate is standard semi-insulating InP:Fe. The active p-i-n photodiode stack is shown generally at 71. The exposed portion of the bottom contact layer is shown at 72 and the electrode contact to this layer at 63. The p-i-n photodiode stack 71 also comprises an etch stop layer 73, intrinsic absorbing layer 74, p$^+$ contact layer 75, and metal contact layer 76. The metal interconnect 64 contacts a portion of the p-layer as shown here and in FIG. 6.

According to a main feature of the invention the bottom n$^+$ contact layer is made transparent to the light incident on the array so that the array can be back-illuminated. For the purpose of the invention transparent is defined as at least 90% and preferably 99% of light incident on the layer is transmitted through the layer. This feature provides several advantages as will be shown later. The material of the bottom contact layer is the quaternary: InGaAsP, with a composition $In_{1-x}Ga_xAs_yP_{1-y}$, where x is approximately 0.3, and y is approximately 0.72. This material has a relatively narrow bandgap, i.e. a bandgap wavelength of 1400 nm, and is transparent in the 1480–1550 nm wavelength range used in typical lightwave systems. Transparency in this range makes this device responsive to the 1480 nm wavelength used for erbium fiber amplifier pump lasers. It also provides low electrical contact resistance. While this material and composition is preferred for implementing the invention, any III–V compound semiconductor may be used as long as the material is essentially transparent to the radiation being detected. For a system operating at 1.48–1.55 $\mu$m, the bandgap of the material should be at least approximately 1.4 $\mu$m. For a system operating at or near 1.3 $\mu$m, the bandgap of the material should be at least 1.2 $\mu$m.

In the photodetector device just described the lower, transparent, layer is doped n-type and the upper contact layer is doped p-type. Those skilled in the art will recognize that the complementary configuration may also be used, i.e. the doping types reversed.

The array may be fabricated using a variety of approaches. The preferred approach is to form the layered stack 71 by sequential deposition of the multiple layers in a single deposition tool, then pattern the stack to produce the pie segmented geometry shown in FIG. 6. Appropriate processing details are as follows.

Substrate 71 is insulating or semi-insulating. In the structure used to demonstrate the principles of the invention the materials used were InP based. The substrate material was iron-doped InP. The four semiconductor layers 72–75 were grown using low pressure Metal Organic Vapor Phase Epitaxy (MOVPE) techniques. This is a standard technique and is described in "Materials Aspects of GaAs and InP Based Structures", Swaminadhan & Macrander, pp. 131–165, Prentice Hall, Inc., 1991; "Reduction of Base-Collector Capacitance By Undercutting the Collector and Subcollector in GaAs/InP DHBT's", Y. Miyamoto et al, IEEE Electron Device Letters, 17, pp. 97–99, 1996.

Referring again to FIG. 7, the first deposited layer 72 is the n-layer of the p-i-n structure and consists of InGaAsP, with n-type doping, e.g. silicon, in the range $10^{18}$ to $10^{19}$ cm$^{-3}$, and a thickness in the range 0.3–0.6 $\mu$m. Layer 73 is undoped InP, with a thickness of approximately 0.05 $\mu$m, and provides a stop etch for the pattern defining sequence. Layer 74 is the absorbing layer and consists of intrinsic InGaAs. The p$^+$ contact layer 75 is InGaAs, with p-type doping, e.g. zinc, in the range $10^{18}$–$10^{20}$, and a thickness in the range 0.1–0.5 $\mu$m. The p$^+$ contact layer may also comprise other III–V materials such as InP or InGaAsP.

To minimize zinc diffusion from the zinc-doped InP layer into the intrinsic InGaAs layer the first three layers were grown at 625° C., while the P$^+$ contact layer is grown at a lower temperature, e.g. 590° C.

A preferred method for etching the semiconductor stack 71 is to use a combination of wet etching and RIE. The RIE etch process improves the sidewall geometry and gives a smaller spacing between segments. It was also found that the use of an oxide hard mask, in place of the conventional photoresist, as the primary etch mask further aids in producing a narrow space between segments. The following step sequence was found to be effective.

The p$^+$- and i-layers were etched using Reactive Ion Etching (RIE) and selective chemical etching, to form the pattern to define the active segments, or p-i-n diodes, 62 (FIG. 6). The InP stop etch layer 73 is used to control the etch depth. Next the individual segments were isolated by masking and etching through the n$^+$ InGaAsP layer 72, again by a combination of RIE and selective chemical etching. The addition of RIE, instead of all chemical etching, reduces the undercut of the masks, and maintains narrow channels (>2 $\mu$m) between diode segments thereby increasing the fill factor of the array. The chemical etch used for patterning the semiconductor layers, and for clean-up etch steps to reduce RIE damage, was HCl:H$_3$PO$_4$ and citric acid:hydrogen peroxide.

Next, the entire p$^+$ layer 75 is metallized with metal layer 76. The metal layer 76 is shown as a single layer for simplicity but in a preferred embodiment comprises a Au—Zn composite structure of Zn/Zn—Au/Au. The metallization can be applied by e-beam evaporation and patterned by conventional masking and etching or by a lift-off process. Other metallization materials can be used. The metallization is preferably reflecting at the wavelengths of interest in which case the metallization functions as a mirror to reflect light that is not absorbed on the first pass in intrinsic layer 74 back into that layer for a second pass, thus increasing the photon capture efficiency of the device. It is preferred that the metallization 76 be at least 70% reflecting. The Au—Zn composite layer just described is approximately 90% reflecting.

Metallizing essentially the entire top semiconductor layer of the p-i-n structure also reduces contact resistance, and improves device performance substantially. Both of the latter advantages are made possible because the device of the invention is back-illuminated.

The thickness of the intrinsic absorbing layer 74 in prior art devices is typically of the order of 0.5 $\mu$m. In the device of the invention, due to the double pass of the incident beam through layer 74, enabled by the presence of mirror metallization layer 75, the thickness of the absorbing layer can be reduced substantially and still retain high efficiency. This reduces the duration and severity of the stack etch step, allowing greater dimensional control and a reduced "kerf" between segments. In the device described here layer 74 has a thickness of 2.3 µm. The thickness is preferably between 1.8 and 3.2 µm to give this advantageous result.

Next, a ~3 µm thick polyimide layer (not shown) is deposited over the whole structure. Windows are opened in the polyimide by RIE for the interconnect metallization, and the interconnect metal can be patterned using a lift-off technique. The wafer was thinned to approximately 150 µm. An optional anti-reflective coating can then be applied to further increase the efficiency of the device. An appropriate anti-reflection coating material is Si/SiO$_2$. The finished wafer is then sawed into 1×1 mm chips. The photogenerator chips were mounted on a suitable mount and packaged in a conventional lightwave package.

Figure 8:
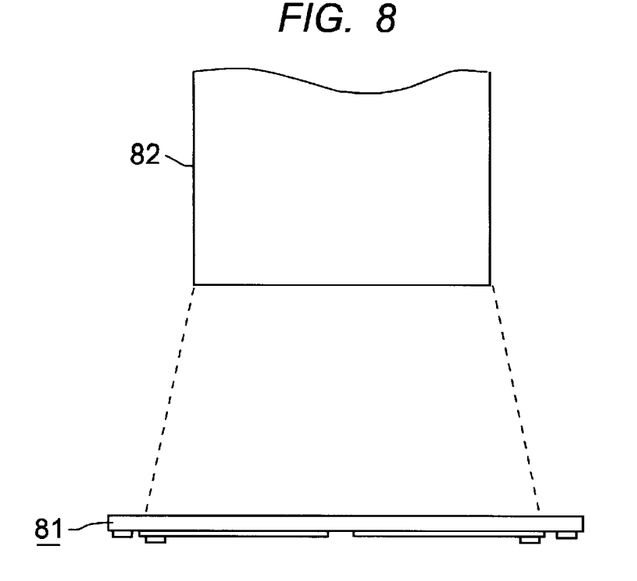
FIG. 8 is a schematic drawing showing the combination of a photodiode array of the invention with an optical fiber light source.

The I–V characteristics and open circuit voltage properties of the 30-segment photogenerator were obtained using 1554 nm incident light. Referring to FIG. 8, the back of the photogenerator 81, i.e. the substrate, was illuminated with a free-space optical beam emanating from a single-mode fiber 82 spaced ~1 mm from the photogenerator. In the diagram the core of the optical fiber is shown for simplicity. The results of those measurements are shown in FIGS. 9 and 10.

Figure 9:
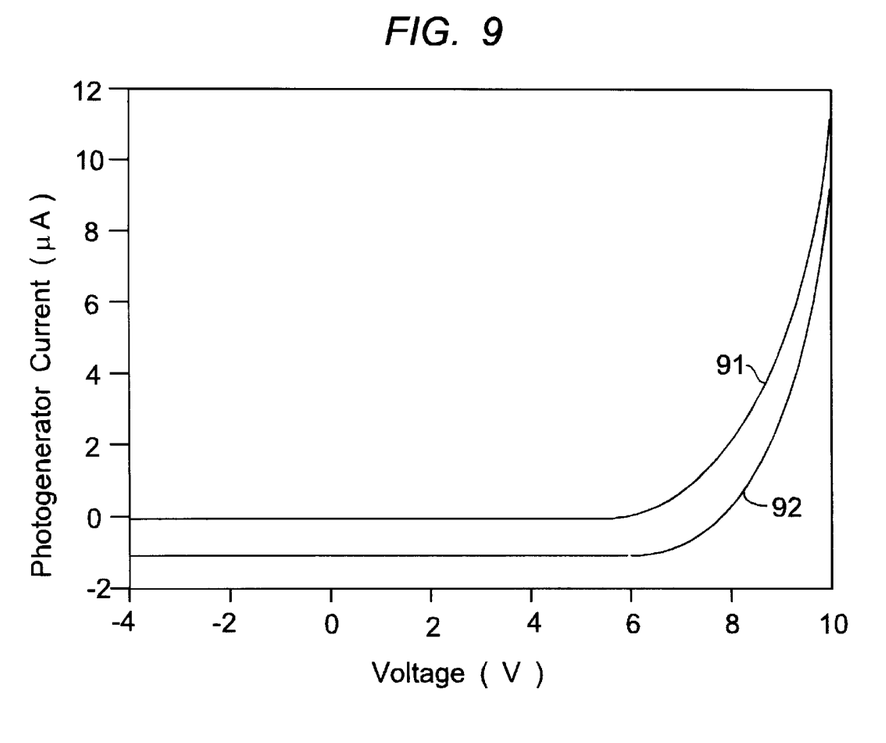
FIGS. 9 and 10 are plots showing electroptic data for the photodiode array of FIG. 6.

FIG. 9 is a plot of photogenerator current in µA vs. voltage in volts showing the photogenerator response with no illumination, curve 91, and exposed to illumination, curve 92. The short-circuit responsivity of this 30 segment device was 0.025 A/W. This efficiency can be compared with the efficiency of an 8 segment photodetector that is front illuminated which provided 0.057 A/W. Taking into account the relative number of segments for these devices, these results demonstrate an improvement in inefficiency of approximately 30×0.025/8×0.057=1.6. This improvement results in part from the improved optical fill-factor made possible by the back illuminated geometry.

Figure 10:
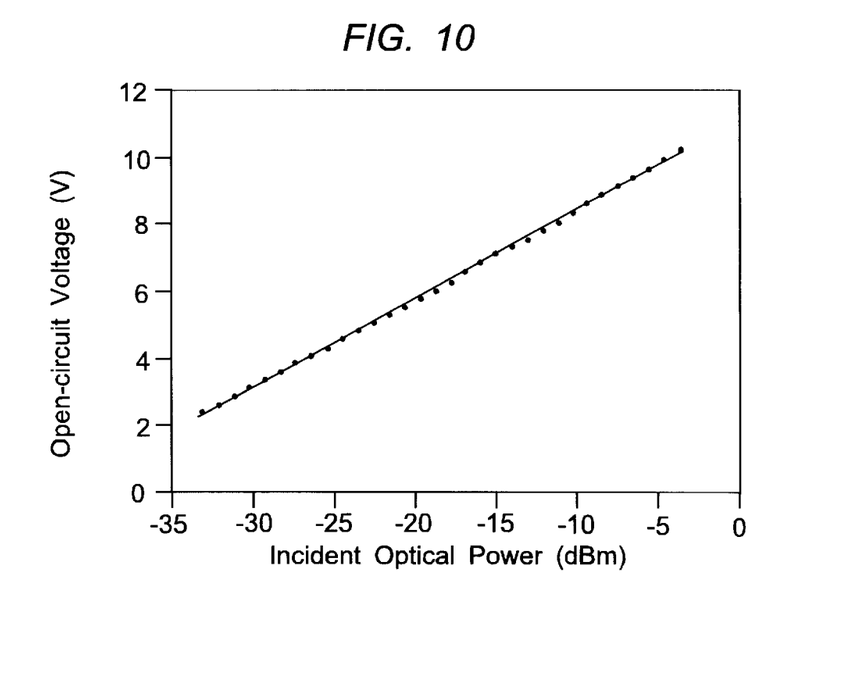

FIG. 10 is a plot of incident optical power in dBm vs. open-circuit voltage in volts. The open-circuit voltage of the photogenerator increased logarithmically with incident power—a maximum voltage of 10.3 V was obtained at 500 µW (−3 dBm). Over the range of incident power P$_{GEN}$=−30 to −3 dBm, the open circuit voltage was V$_{OC}$=V$_O$+gP$_{GEN}$, where V$_O$=11.02 V and g=0.272 V/dBm. With no illumination, the open-circuit voltage was 30 kT=750 mV. The I–V characteristic of the photogenerator in dark conditions was well described by the diode equation:

$$I = I_s\left(\exp\frac{V}{nNkT} - 1\right)$$

where I$_S$=3.95 nA is the diode saturation current, n=1.67 is a nonideality factor, N=30 is the number of sectors, and kT=25 mV. The low observed saturation current is particularly advantageous in low power applications.

The high photogenerator voltages obtained with modest incident power are well-suited to powering many devices including low-power microcontrollers and micromechanical devices. For example, electrostatic micromechanical optical switches and attenuators can operate with less than 5 V and consume no quiescent current as they appear only as capacitive loads to the photogenerator. At these voltage levels, optically-actuated circuits would require less than 5 µW (−23 dBm) to function.

Figure 11:
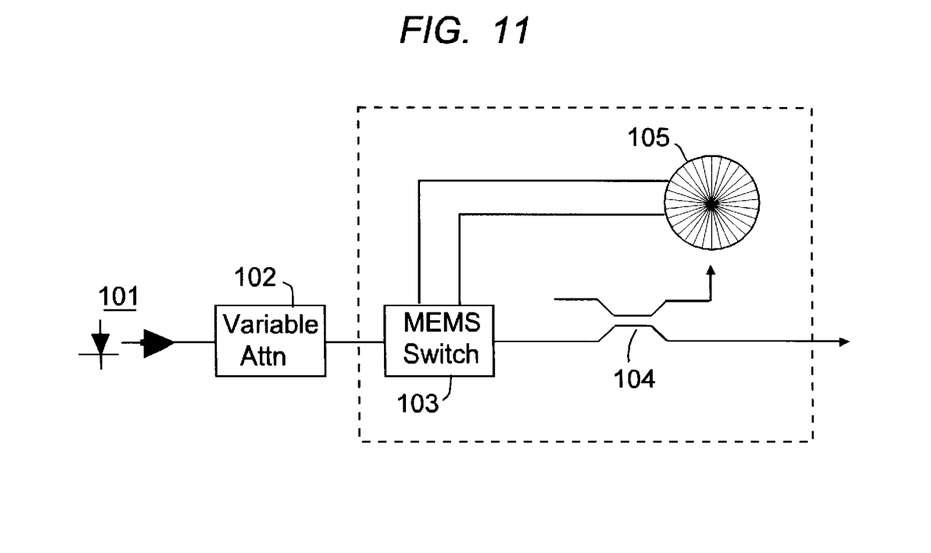
FIG. 11 is a diagram showing the photogenerator used as an optical power limiter.
Figure 12:
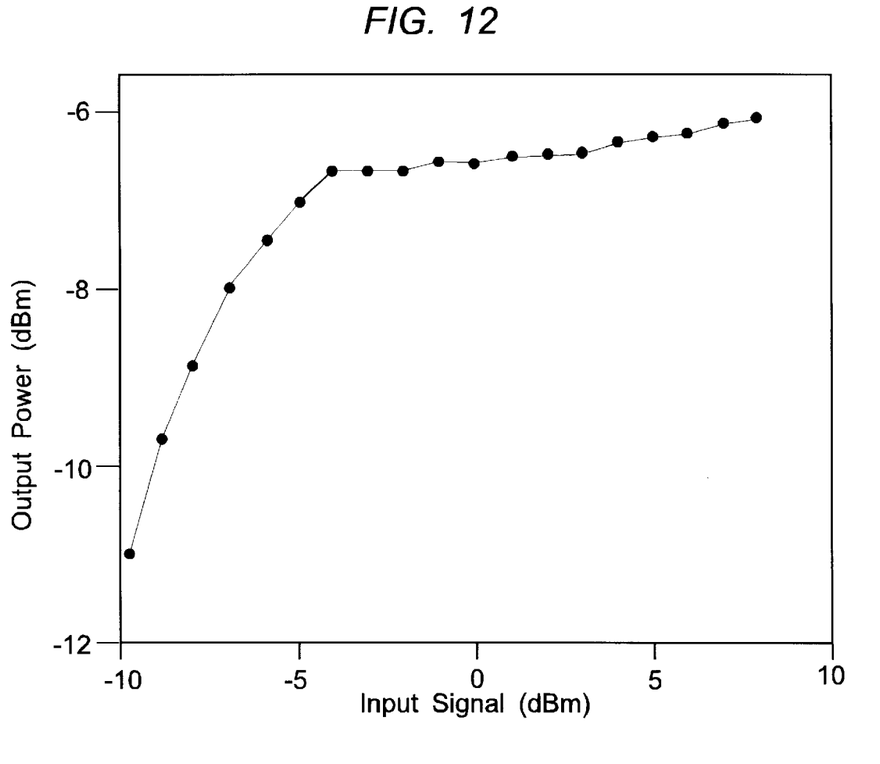
FIGS. 12 and 13 are plots showing electrical data for the device of FIG. 11.
Figure 13:
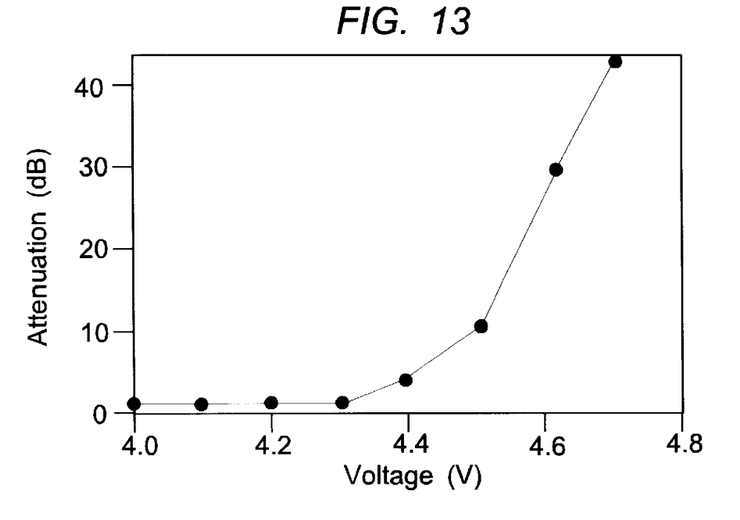

A demonstration of the use of the invention in a typical system application will be described in connection with FIGS. 11–13. This is but one example of the wide variety of uses for the photodetector. Other examples were given earlier. In this example, FIG. 11 shows the system configuration and comprises laser and amplifier source 101, variable attenuator 102, microelectromechanical switch (MEMS) 103, optical coupler 104, and the 30 segment photogenerator of the invention 105. The output power in dBm, P$_{OUT}$, versus input signal power in dBm, P$_{IN}$, of an optical power limiter built with a MEMS shutter powered by the photogenerator in the feedback configuration of FIG. 11, is shown in FIG. 12. A 2% tap (fraction, F=−17 dB) diverted a small amount of the output light from the shutter to the photogenerator via coupler 104 (FIG. 11). A plot of voltage vs. attenuation in the shutter is shown in FIG. 13. As can be deduced from FIGS. 12 and 13, as the input power increases so does the photogenerator voltage, closing the MEMS switch and increasing the attenuation. The output power is thereby limited against power swings in the input. Approximating the switch attenuation, A (in dB) as a piecewise linear function, i.e., $$A=A_0 \quad 0<V<V_S$$

$$A=a(V-V_S)+A_0 \quad V>V_S$$

where V$_S$ is a threshold voltage above which the attenuation begins to increase, then the regulation of the input power when V>V$_S$ is:

$$R=\Delta P_{OUT}/\Delta P_{IN}=1/(1+ag) \text{ (optical power in dBm)}.$$

Good agreement was obtained between R~0.09, estimated from the switch and photogenerator parameters, and the measured value R=0.083. With these approximations, the threshold output power above which limiting starts is:

$$P_{threshold}=F+(V_S-V_0)/g=-7.7 \text{ dBm, for } V_S=4.3 \text{ V}.$$

In the demonstration of an optical limiter, the output power changed from −7 to −6 dBm as the input power varied from −4 to +9 dBm.

The configurations for the photodiode array as described above are given as examples of a very large number of alternative configurations that will occur to those skilled in the art to produce approximately the same photocurrent when illuminated with the output of an optical fiber. It is preferred that the maximum variation in the photogenerated current from the individual photodetector elements in the array be less than 25%. This objective can usually be realized by equalizing the area of each photodiode segment to within +25%.

Those skilled in the art will recognize that a 2×2 array gives an intrinsically equal fill factor, but a 2×2 array of long wavelength photodetectors will generally not provide the desired voltage levels. An option is to use silicon as the photodiode material. Adequate voltages are easily obtained with silicon diodes but the power wavelength must be below 950 nm. These shorter wavelengths may be useful in less demanding applications, but the higher attenuation of the optical fiber at these wavelengths will reduce the overall efficiency of these systems well below optimum. Thus for the purposes of this invention it is preferred that the power signal have a wavelength greater than 950 nm to avoid power loss in the fiber. To achieve voltage levels in the range of interest, it is preferred that the array have at least eight individual diodes.

Generally speaking, typical dimensions of a useful array according to the invention will be substantially larger than the output beam, i.e. core, of the optical fiber supplying the power signal. The beam is expanded so a larger photodiode array area can be illuminated. Typical single mode fiber cores are of the order of ten microns in diameter. The array used to demonstrate the invention was about 65 microns in diameter and the beam covered the array.

While the array design we chose to demonstrate the invention was a pie-shaped array with each element shaped like a piece or segment of the pie, a configuration which gives near optimum match to the beam diameter, other geometries can be used as well. For example, a diode array having the configuration of a polygon is essentially the equivalent of the circular shaped array of FIG. 6. In the circular shaped array each element or segment can be defined as having a sector shape. In the case of the polygon shaped array each element or segment has a triangle shape. Other options yielding a circular symmetry will occur to those skilled in the art. For example, concentric rings of diodes arranged in a circular pattern fall within the definition of circularly symmetric but these would require tailoring the diode shapes from ring to ring to account for the diminished beam intensity from the inner ring to the outer ring or rings. The most effective and therefore preferred detector configuration is one in which all detectors have the same size and shape, and arrayed with circular symmetry, so that an optical beam with the center of the beam aligned on the point of circular symmetry of the detector array gives equal optical intensity on each element of the array.

The circularly symmetric array just described was a mesa structure integrated on a semi-insulating substrate. Techniques may be developed to fully integrate arrays in an isoplanar configuration. For example, dielectric isolation techniques like those used in power devices may be employed. Junction isolation is another choice that allows for planar structures with high packing density, i.e. less dead space in the illuminated area.

The remote power systems detailed above are described as useful to operate mechanical and optical equipment. The term "electrically operated apparatus" is meant to include these and other forms of apparatus for which these remote power systems can be used to advantage.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A photogenerator for detecting light in the wavelength band 1480–1550 nm comprising a plurality of photodiodes, each of said photodiodes comprising:
   a. a substrate comprising InP, said substrate having a bottom surface and a top surface,
   b. a p-i-n diode formed on the top surface of said substrate said p-i-n diode comprising:
      i. a first III–V semiconductor layer on said substrate, said III–V semiconductor layer having a first conductivity type,
      ii. a second III–V semiconductor layer on said first III–V semiconductor layer, said second III–V semiconductor layer being essentially intrinsic,
      iii. a third III–V semiconductor layer on said second III–V semiconductor layer, said third III–V semiconductor layer having a conductivity type opposite to the conductivity type of said first III–V semiconductor layer,
   c. a metal layer covering essentially the entire p-type layer, said metal layer being at least 70% reflecting of a wavelength in said wavelength band, said plurality of photodiodes each having an area A±25%, and said plurality of photodiodes being electrically connected in series.

2. The photogenerator of claim 1 wherein said third III–V semiconductor layer is p-type, and comprises a material selected from the group consisting of InP, InGaAs, and InGaAsP.

3. The photogenerator of claim 1 wherein said first III–V semiconductor layer is n-type.

4. The photogenerator of claim 3 wherein said first III–V semiconductor layer comprises InGaAsP.

5. The photogenerator of claim 4 wherein said second III–V semiconductor layer comprises InGaAs.

6. The photogenerator of claim 1 further including an anti-reflection coating on said bottom surface of said substrate.

7. A photodiode array for detecting light of wavelength $\lambda$ comprising:
   a. an insulating or semi-insulating substrate, said substrate having a top surface and a bottom surface,
   b. a first array of N sector-shaped semiconductor regions on the top surface of said substrate, said semiconductor regions:
      i. being of a material having a first conductivity type,
      ii. being transparent to light of wavelength $\lambda$,
      iii. being electrically isolated from each other,
      iv. arranged in the configuration of a circle,
   c. a second array of N sector-shaped semiconductor regions of intrinsic semiconductor overlying the first sector-shaped regions and essentially congruent therewith, said second sector-shaped semiconductor regions having a shape essentially the same as the first sector-shaped semiconductor regions, and a size equal to or smaller than the first sector-shaped semiconductor regions,
   d. a third array of N sector-shaped semiconductor layers with a conductivity type opposite to that of the first conductivity type overlying the second array of sector-shaped semiconductor regions with the same shape and approximate size as the second array thus forming an array of N p-i-n photodiodes,
   e. a metal layer covering essentially the entire area of each of said third array of layers, said metal layer being of a material that is at least 70% reflective of light of wavelength $\lambda$, and
   f. means, including said metal layer of e., for electrically connecting the N p-i-n photodiodes serially together.

8. The photodiode array of claim 7 further including an anti-reflection coating on said bottom surface of said substrate.

9. The photodiode array of claim 7 further including an optical fiber with the center of the core of the optical fiber positioned so that light emitted from the core is incident on said substrate.

10. The photodiode array of claim 7 in which N is at least 8.

11. A photodiode array for detecting light of wavelength $\lambda$ comprising:
   a. an insulating or semi-insulating substrate, said substrate having a top surface and a bottom surface,
   b. a first array of N triangle-shaped semiconductor regions on the top surface of said substrate, said semiconductor regions:
      i. being of a material having a first conductivity type,
      ii. being transparent to light of wavelength $\lambda$, iii. being electrically isolated from each other,
iv. arranged in the configuration of a polygon,
c. a second array of N triangle-shaped semiconductor regions of intrinsic semiconductor overlying the first triangle-shaped regions and essentially congruent therewith, said second triangle-shaped semiconductor regions having a triangle shape with a base and height equal to or less than the base and height of the first triangle-shaped semiconductor regions,
d. a third array of N triangle-shaped semiconductor layers with a conductivity type opposite to that of the first conductivity type overlying the second array of triangle-shaped semiconductor regions with the same shape and approximate size as the second array thus forming an array of N p-i-n photodiodes,
e. a metal layer covering essentially the entire area of each of said third array of layers, said metal layer being of a material that is at least 70% reflective of light of wavelength $\lambda$, and
f. means, including said metal layer of e., for electrically connecting the N p-i-n photodiodes serially together.

12. The photodiode array of claim 11 further including an anti-reflection coating on said bottom surface of said substrate.

13. The photodiode array of claim 11 further including an optical fiber with the center of the core of the optical fiber positioned so that light emitted from the core is incident on said substrate.

14. The photodiode array of claim 11 in which N is at least 8.

15. A lightwave system comprising:
a. a sending station,
b. a terminal station,
c. at least one optical fiber end connecting the sending station with the terminal station, said optical fiber having an optical beam input end at the sending station and an optical beam output end at the terminal station,
d. a power laser light source with a wavelength $\lambda$ at the sending station connected to said at least one optical fiber for launching an optical beam through said optical fiber,
e. an electrically operated apparatus at the terminal station,
f. a photodetector at the terminal station for detecting light with wavelength $\lambda$, with the electrical output of the photodetector connected to said electrically operated apparatus, said photodetector comprising:

i. a semiconductor substrate, said substrate having a top surface and a bottom surface,
ii. a photodiode array of at least eight p-i-n diodes formed on the top surface of said substrate, said p-i-n diodes being sectors of a polygon or circle with essentially the same size and shape, with each of said p-i-n diodes comprising:
i'. a first semiconductor layer of a first conductivity type on said substrate, said first semiconductor layer being transparent to light of wavelength $\lambda$,
ii'. a second semiconductor layer of essentially intrinsic semiconductor on said first semiconductor layer,
iii'. a third semiconductor layer on said second semiconductor layer having a conductivity type opposite to that of said first semiconductor layer,
iv'. a metal layer covering essentially the entire third semiconductor layer, said metal layer being at least 70% reflecting of wavelength $\lambda$,
iii. means for electrically connecting said photodiodes in series,
g. means for directing the optical beam from the output end of the optical fiber onto said substrate of the photodetector.

16. The system of claim 15 further including an anti-reflection coating on said bottom surface of said substrate.

17. The system of claim 15 in which $\lambda$ is greater than 950 nm.

18. The system of claim 15 in which the electrically operated apparatus operates at a voltage of at least 3.0 volts.

19. The system of claim 15 in which the optical fiber is a single mode fiber.

20. The system of claim 19 in which the optical fiber has a core diameter of the order of 10 microns or less.

21. The system of claim 15 in which the photodiode current response from the individual photodiodes in the array varies by less than about 25%.

22. The system of claim 15 in which said substrate comprises InP.

23. The system of claim 22 in which said first semiconductor layer comprises n-type InGaAsP.

24. The system of claim 23 in which said second semiconductor layer comprises InGaAs.

25. The system of claim 24 in which the third semiconductor layer comprises p-type InGaAs.

* * * * *